United States Patent [19]
Fox

[11] Patent Number: 5,264,804
[45] Date of Patent: Nov. 23, 1993

[54] LOWPASS FILTER WITH IMPROVED D.C. OFFSET PERFORMANCE

[75] Inventor: Timothy R. Fox, Chicago, Ill.

[73] Assignee: Kabushiki Kaisha Toshiba, Kanagawa, Japan

[21] Appl. No.: 830,571

[22] Filed: Feb. 5, 1992

[51] Int. Cl.$^5$ ............................................. H03K 5/00
[52] U.S. Cl. ..................................... 428/167; 328/209; 307/491; 307/520; 307/521; 330/9
[58] Field of Search ................. 328/167, 209; 307/491, 307/520, 521; 330/9

[56] References Cited

U.S. PATENT DOCUMENTS

| | | | |
|---|---|---|---|
| 3,772,604 | 11/1973 | Hogg et al. | 328/162 |
| 4,322,687 | 3/1982 | Dwarakanath et al. | 330/9 |
| 4,377,759 | 3/1983 | Ohhata et al. | 307/520 |
| 4,833,418 | 5/1989 | Quintus et al. | 330/9 |
| 4,906,928 | 3/1990 | Gard | 328/167 |

Primary Examiner—William L. Sikes
Assistant Examiner—Scott A. Ouellette
Attorney, Agent, or Firm—Finnegan, Henderson, Farabow, Garrett & Dunner

[57] ABSTRACT

A lowpass filter with improved D.C. offset characteristics is disclosed. The lowpass filter includes an adjustable amplifier, an offset detecting circuit for producing an offset signal proportional to the D.C. offset between the voltage from the adjustable amplifier and the voltage to the lowpass filter, and a feedback circuit for producing a feedback signal in response to the offset signal which controls the adjustable amplifier to reduce the D.C. offset.

10 Claims, 4 Drawing Sheets

LOWPASS FILTER WITH IMPROVED D.C. OFFSET PERFORMANCE

BACKGROUND OF THE INVENTION

1. Field of the Invention

The present invention relates to a lowpass filter circuit, and more particularly, a lowpass filter circuit with improved D.C. offset performance.

2. Description of the Related Art

Generally, filtering circuits may be divided into three distinct categories: highpass, bandpass, and lowpass. Of these three filter categories, usually only lowpass filters have design considerations related to D.C. voltage levels.

Conventionally, integrated circuit (I.C.) filters are commercially available in many types, such as Butterworth, Chebychev, Bessel, etc., and may be of various orders. The frequency characteristics of these integrated circuit filters are often easily adjustable. For example, in conventional switched capacitor lowpass filters, a single clock frequency may be used to select the upper frequency cutoff.

In some filtering applications, it is necessary to prevent a D.C. offset from being introduced by the filtering circuit. D.C. offset refers to unwanted D.C. voltage differences between the input and output of a filtering circuit. For example, the D.C. offset of a linear filter circuit is the D.C. (zero-frequency) component of the output signal when the D.C. component of the input signal is zero. In particular, it is often necessary to ensure that the D.C. voltage level of an input signal is faithfully passed through the lowpass filter and is present at the output. A drawback to conventional I.C. lowpass filters is that they often introduce an undesired D.C. offset voltage.

A conventional approach to this problem has been to add a resistive-capacitive (R-C) lowpass filter external and in parallel to the I.C. filter to pass the D.C. input voltage level through to the output. However, this additional resistor and capacitor form one of the poles that determine the overall frequency characteristics of the filter circuit, and this pole is not easily adjustable.

Another conventional attempt to correct this D.C. offset problem has been to use an integrator connected to the output of the lowpass filter to generate a feedback signal to reduce the D.C. output of the filter to zero. However, this approach simply eliminates any D.C. component from the output, and undesirably removes any D.C. component that was present in the input signal.

SUMMARY OF THE INVENTION

The objects of the invention are to provide a lowpass filter circuit which does not introduce a D.C. offset voltage into the output signal and which faithfully passes the voltage levels of the D.C. component of the input signal to the filter output.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

To achieve the objects and in accordance with the purpose of the invention, as embodied and broadly described herein, the invention relates to a lowpass filter having a filter input that receives an input signal having a D.C. component and a filter output that provides an output signal, comprising means for lowpass filtering the input signal to produce a filtered signal, adjustable amplifying means for amplifying the filtered signal to produce the output signal, offset detecting means connected to the filter input and the filter output for producing an offset signal corresponding to the D.C. offset between the output signal and the input signal, and feedback means connected to the offset detecting means and the adjustable amplifying means, for producing a feedback signal corresponding to the offset signal and for controlling the adjustable amplifying means to reduce any offset of the D.C. component of the input signal.

It is to be understood that both the foregoing general description and the following detailed description are exemplary and explanatory only, and are not restrictive of the invention as claimed.

The accompanying drawings, which are incorporated in and constitute a part of this specification, illustrate several embodiments of the invention, and together with the description, serve to explain the principles of the invention.

DESCRIPTION OF THE PREFERRED EMBODIMENTS

Reference will now be made in detail to the present preferred embodiments of the invention, examples of which are illustrated in the accompanying drawings. Wherever possible, the same reference numbers will be used throughout the drawings to refer to the same or like parts.

Figure 1:
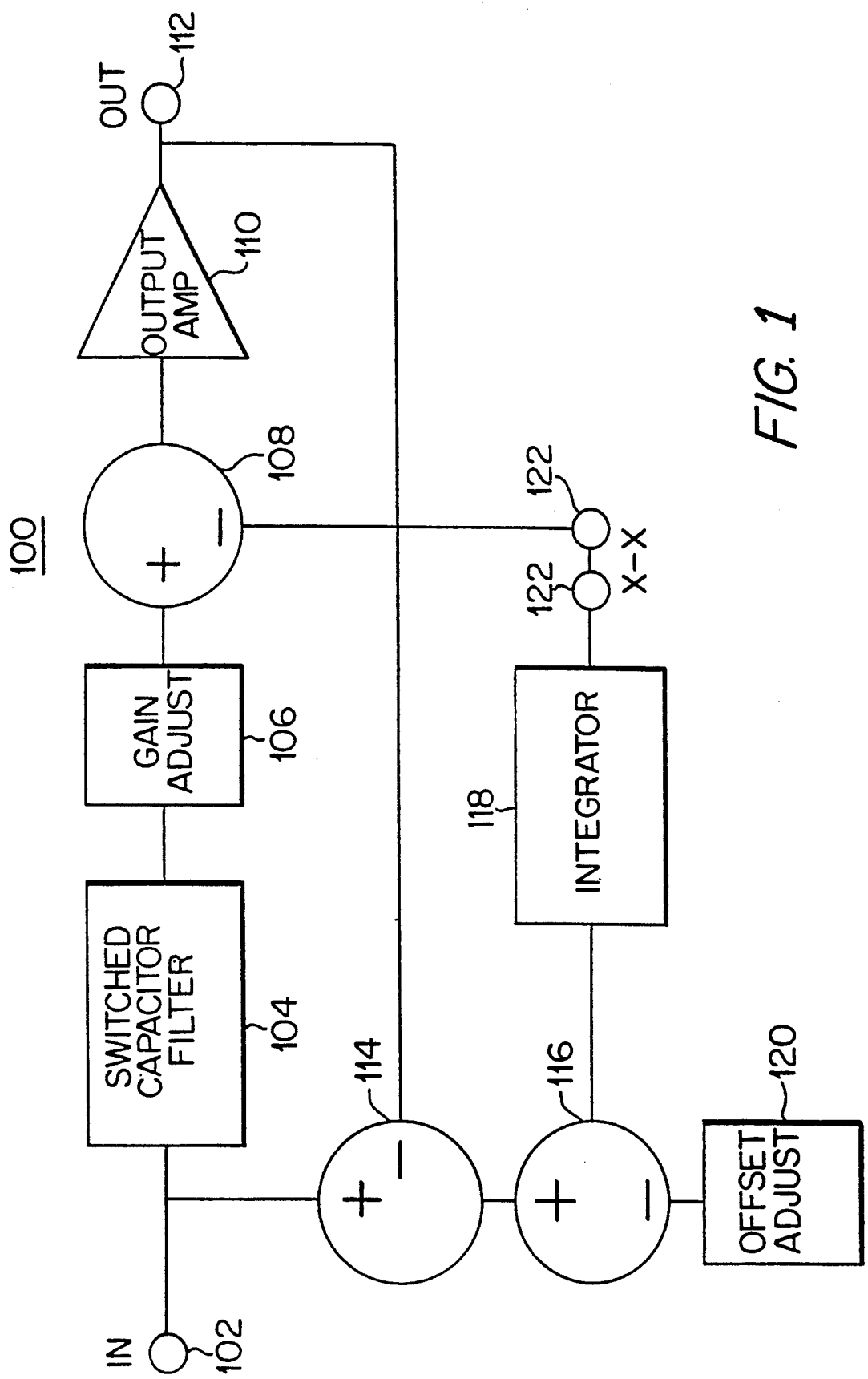
FIG. 1 is a block diagram of a lowpass filter circuit.

In accordance with the invention, means for lowpass filtering an input signal is provided to produce a filtered signal. As shown in FIG. 1, lowpass filtering circuit receives an input signal through terminal 102 which is applied to a switched capacitor filter block 104. It should be understood that any appropriate lowpass filter can be used for this element of the present invention.

The present invention also includes adjustable amplifying means for amplifying the filtered signal that is provided by the lowpass filtering means. As shown in FIG. 1, a gain adjust block 106 is connected to switched capacitor filter 104 and to the positive input of a summing block 108. The summing block 108 is connected to output amp 110 which provides an output to terminal 112. Alternatively, the gain adjust block 106 could be connected between the summing block 108 and the output amplifier 110.

In accordance with the invention, the filter further includes offset detecting means connected to the filter input and the filter output for producing an offset signal corresponding to the difference between the output signal and the input signal. As shown in FIG. 1, the positive input of summing block 114 receives the input signal from terminal 102. The negative input of summing block 114 receives the output signal from the output amp 110. Summing block 114 produces an offset signal corresponding to the difference between the output signal from the output amp 110 and the input signal to terminal 102. Summing block 114 provides an output to the positive input of summing block 116.

The present invention further includes feedback means connected to the offset detecting means and the amplifier means for producing a feedback signal corresponding to the D.C. offset and for controlling the adjustable amplifying means to reduce any D.C. offset of the D.C. component of the input signal. As shown in FIG. 1, the positive input of summing block 116 is connected to the output of summing block 114. The output of summing block 116 is connected to an integrator block 118. Offset adjust block 118 is connected to the negative input of summing block 116 to provide any necessary offset to the signal provided to the integrator 118. Offset adjustment provided by offset adjust block 120 will be more fully explained hereinafter. Integrator 118 provides an output to the negative input of summing block 108 through terminals 122.

The operation of the lowpass filtering circuit 100 will now be briefly explained. Summing block 114 will produce an output from the difference between the input at terminal 102 and the output at terminal 112. This output from summing block 114, minus any offset adjustment, will be provided to integrator 118 which will integrate its input over time and produce an appropriate output signal. The output of integrator 118 responds to the D.C. component of the input to integrator 118 (output of summing block 114). The output signal from the integrator 118 will be provided through terminals 122 to the negative input of summing block 108, thereby appropriately affecting the signal output from summing block 108 to reduce any D.C. offset of the D.C. component of the input signal. The feedback means must have a sufficiently long time constant to avoid adversely affecting the frequency response of the switched capacitor filter 104.

Figure 2:
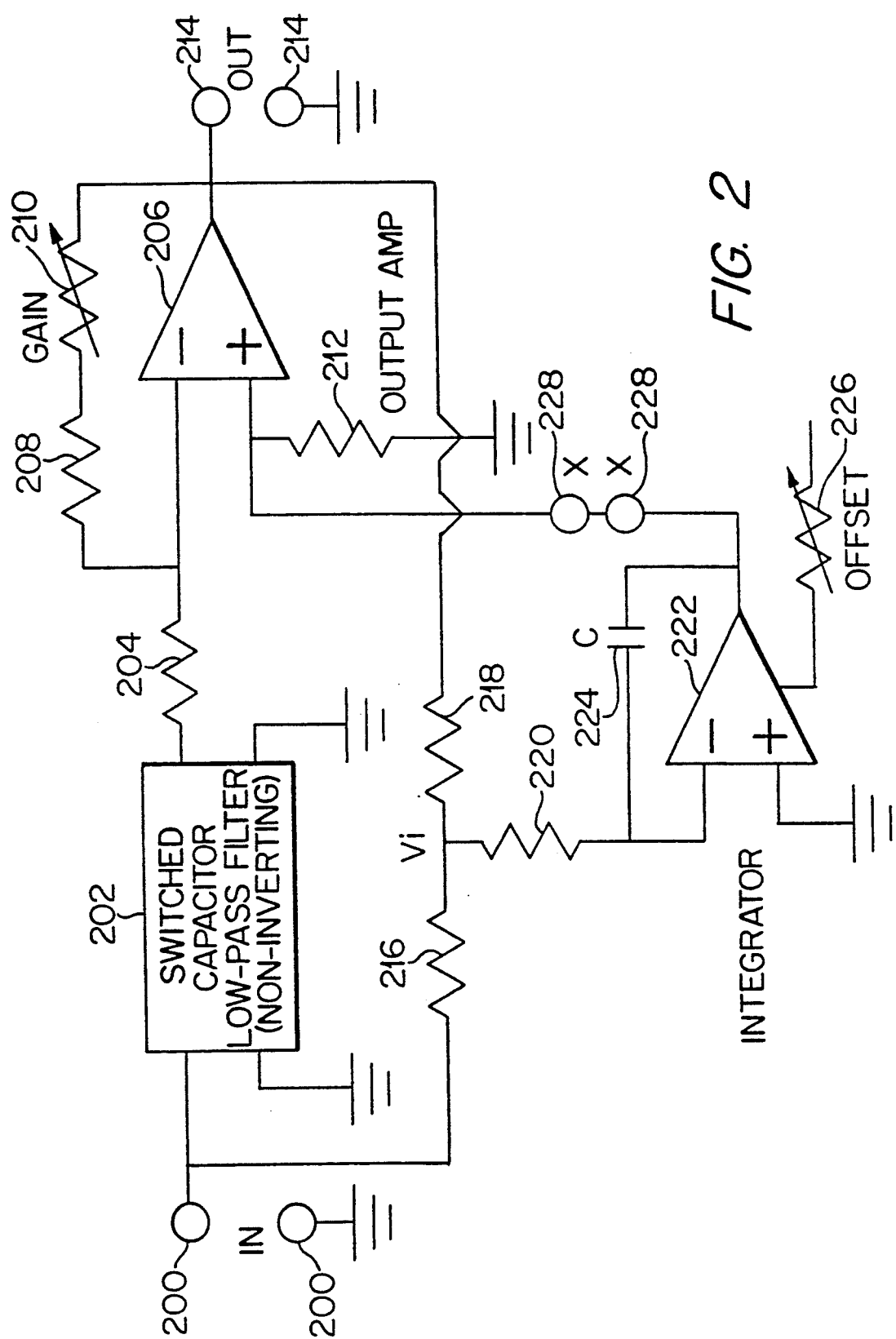
FIG. 2 is a circuit diagram of a preferred lowpass filter circuit.

A preferred implementation of the invention is shown in FIG. 2. An input signal is applied to terminals 200. The input signal is then applied to a switched capacitor lowpass filter 202. The switched capacitor lowpass filter 202, which is of the non-inverting type, may be readily controlled by various control signals (not shown).

Resistor 204 connects the output of switched capacitor lowpass filter 202 to the inverting terminal of operational amplifier 206. A feedback path from the output to the inverting terminal of operational amplifier 206 is provided by resistor 208 and variable resistor 210. Variable resistor 210 may be used to adjust the gain of the operational amplifier 206.

The non-inverting terminal of operational amplifier 206 is connected to ground through resistor 212. The output of operational amplifier 206 is connected to one of the output terminals 214.

Resistor 216 is connected to the input terminal 200 of the switched capacitor lowpass filter 202 at one end and to resistor 218 at the other end. Resistor 218 is connected to the output of operational amplifier 206 and to output terminals 214.

Resistors 216 and 218 form a voltage divider between the output and input voltages of the filter and generate voltage $V_i$ which is proportional to the sum of the output voltage from operational amplifier 206 and the input voltage to switched capacitor lowpass filter 202. In the preferred embodiment, the voltage divider resistors 116 and 118 are precision resistors of equal resistance. It should be understood that the overall gain of the lowpass filter circuit (including amplifier 206) is preferably $-1$, and, therefore, the D.C. component of $V_i$ will be exactly equal to zero when no D.C. offset exists between the input voltage at terminal 200 and the output voltage at terminal 214.

Resistor 220 is connected to the node between resistor 216 and resistor 218. The other end of resistor 220 is connected to the inverting terminal of operational amplifier 222. Capacitor 224 is connected between the output and inverting terminal of operational amplifier 222. The non-inverting terminal of operational amplifier 222 is connected to ground. A variable resistor 226 is connected to operational amplifier 222 to control the D.C. offset of operational amplifier 222. The D.C. offset of operational amplifier 222 is simply the D.C. voltage difference between the inverting and non-inverting input terminals of operational amplifier 222 that will make the output voltage of operational amplifier 222 equal to zero.

The output of operational amplifier 222 is connected through a pair of terminals 228 to the non-inverting terminal of operational amplifier 206.

The operation of the circuit shown in FIG. 2 will now be described. When a voltage offset occurs between the input terminals 200 and the output terminals 214, such as may result from an undesirable D.C. offset injected by switched capacitor lowpass filter 202, a nonzero voltage $V_i$ is generated by the voltage divider circuit including resistors 216 and 218.

Resistor 220, operational amplifier 222, and capacitor 224 integrate over time the nonzero voltage $V_i$, and produce a feedback signal that is opposite in polarity from the D.C. component of voltage $V_i$.

This feedback signal is applied to the non-inverting input terminal of operational amplifier 206 to counteract the D.C. offset of the entire filter. For example, if a negative D.C. offset is added to the output of the switched capacitor lowpass filter 202, this would result in a positive D.C. offset voltage at the output terminal 214. This generates a positive D.C. component of the voltage $V_i$, which is applied to the inverting input terminal of operational amplifier 222. Resistor 220, operational amplifier 222, and capacitor 224 integrate voltage $V_i$ and provide a large negative voltage to the non-inverting input terminal of operational amplifier 206. This negative input voltage adds a negative voltage to the positive offset voltage at output terminal 214. The ideal equilibrium condition of the preferred embodiment exists when:

the D.C. component of $V_i$ is zero;
the D.C. voltage at terminal 228 is an appropriate constant value to make the D.C. component of $V_i$ equal to zero; and
the output voltage at terminal 228 does not change (because the D.C. component of $V_i$ is zero).

The time constant of the preferred embodiment (for example, the product of the capacitance of capacitor 224 and the total circuit resistance of the network comprising resistors 216, 218, and 220) must be long enough to extract the zero-frequency component from voltage $V_i$, while rejecting any components to voltage $V_i$ whose frequencies are an appreciable fraction of the cut-off frequency of the lowpass filter. At frequencies above the cut-off frequency, there will be a large difference between the input and output signals, by the expected performance of the filter. At frequencies near the cutoff frequency, the difference between the magnitudes of the input and output signals may be small, but there will be an important phase shift between the input and output signals. At very low frequencies, the phase shift through a lowpass filter should be negligible. If a longer time constant for the integration is needed, the value of resistor 120 can be increased.

Figure 3:
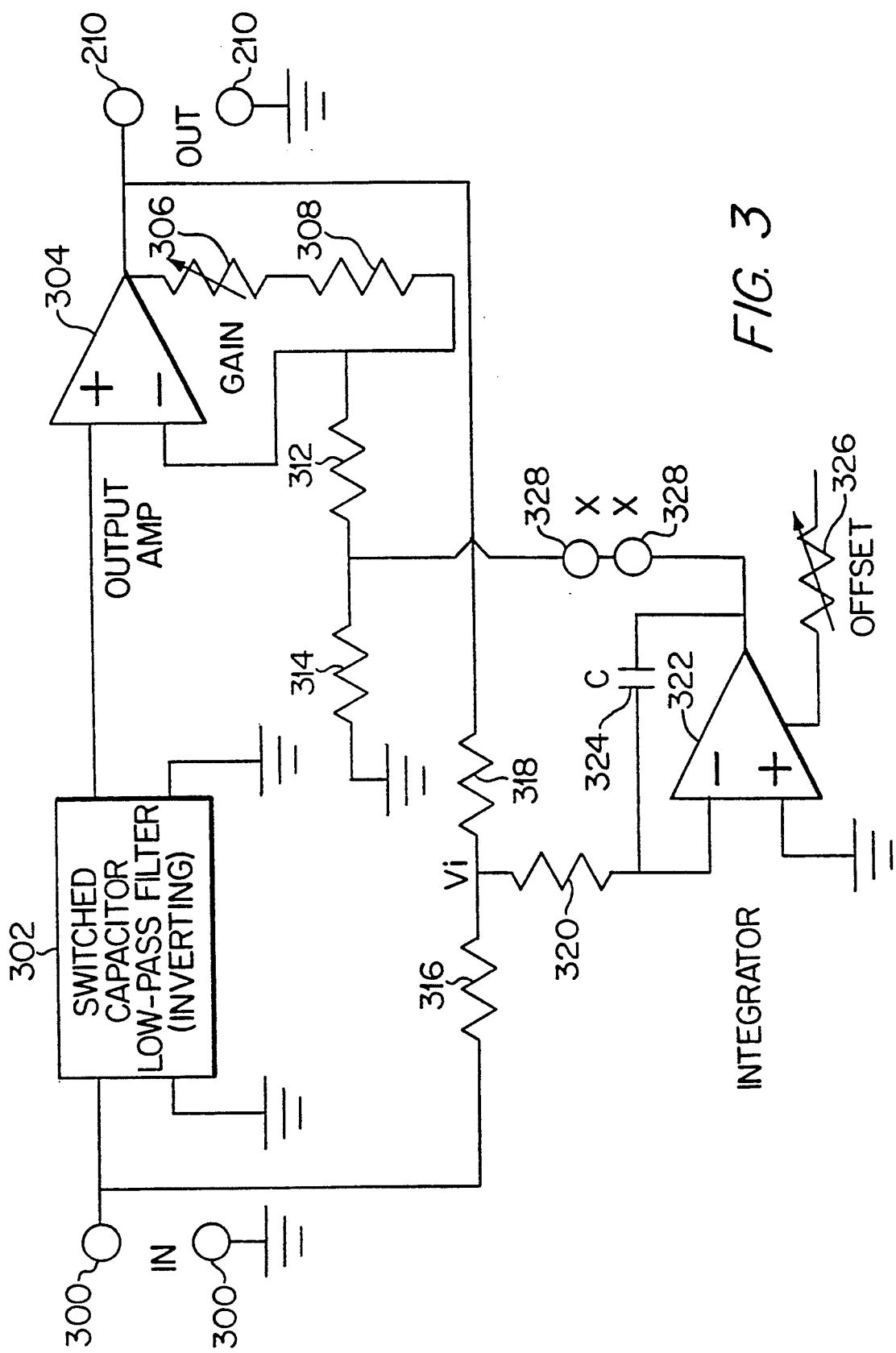
FIG. 3 is a circuit diagram of an alternate embodiment of a lowpass filter circuit.

An alternate embodiment of the present invention is shown in FIG. 3. A switched capacitor lowpass filter 302 of the inverting type receives an input voltage from terminals 300. The output of the switched capacitor lowpass filter 302 is applied to the non-inverting terminal of operational amplifier 304. The output of operational amplifier 304 is fed back t the inverting terminal through variable resistor 306 and resistor 308. Variable resistor 306 may be used to adjust the gain of the operational amplifier 304.

Input terminal 300 is connected to resistor 316. The other end of resistor 316 is connected to resistor 318, which is connected to the output of the operational amplifier 304. Resistors 316 and 318 form a voltage divider circuit to generate voltage $V_i$.

Resistor 320, operational amplifier 322, and capacitor 324 operate as an integrator to produce a feedback signal. Operational amplifier 322 has a variable resistor 226 connected to adjust its voltage offset. As discussed above, the feedback means, including resistor 320, operational amplifier 322, and capacitor 324, must have a sufficiently long time constant to avoid adversely affecting the frequency response of switched capacitor lowpass filter 302. Of course, if a longer time constant is needed, the value of resistor 320 can be increased.

The embodiment shown in FIG. 2 and the embodiment shown in FIG. 3 both are designed to have a negative overall gain. In particular, because the switched capacitor lowpass filter 302 in FIG. 3 is of the inverting type, the adjustable amplifying means is configured to produce a positive gain. However, in FIG. 2, a non-inverting switched capacitor lowpass filter 202 was utilized, and therefore the adjustable amplifying means is configured to produce a negative gain. Of course, an overall positive gain could be readily achieved with appropriate modification by applying the principles set forth in the description of the block diagram shown in FIG. 1.

When a nonzero D.C. component of voltage $V_i$ is generated in FIG. 3, a feedback signal is generated at the output of operational amplifier 322. The feedback signal is applied to the inverting terminal of operational amplifier 304 through resistor 312. The output of operational amplifier 322 is also connected to ground through resistor 314. Therefore, the feedback signal from operational amplifier 322 controls the operational amplifier 304 to drive the D.C. component of voltage $V_i$ to zero, thereby removing any unwanted D.C. offset from the circuit.

Figure 4:
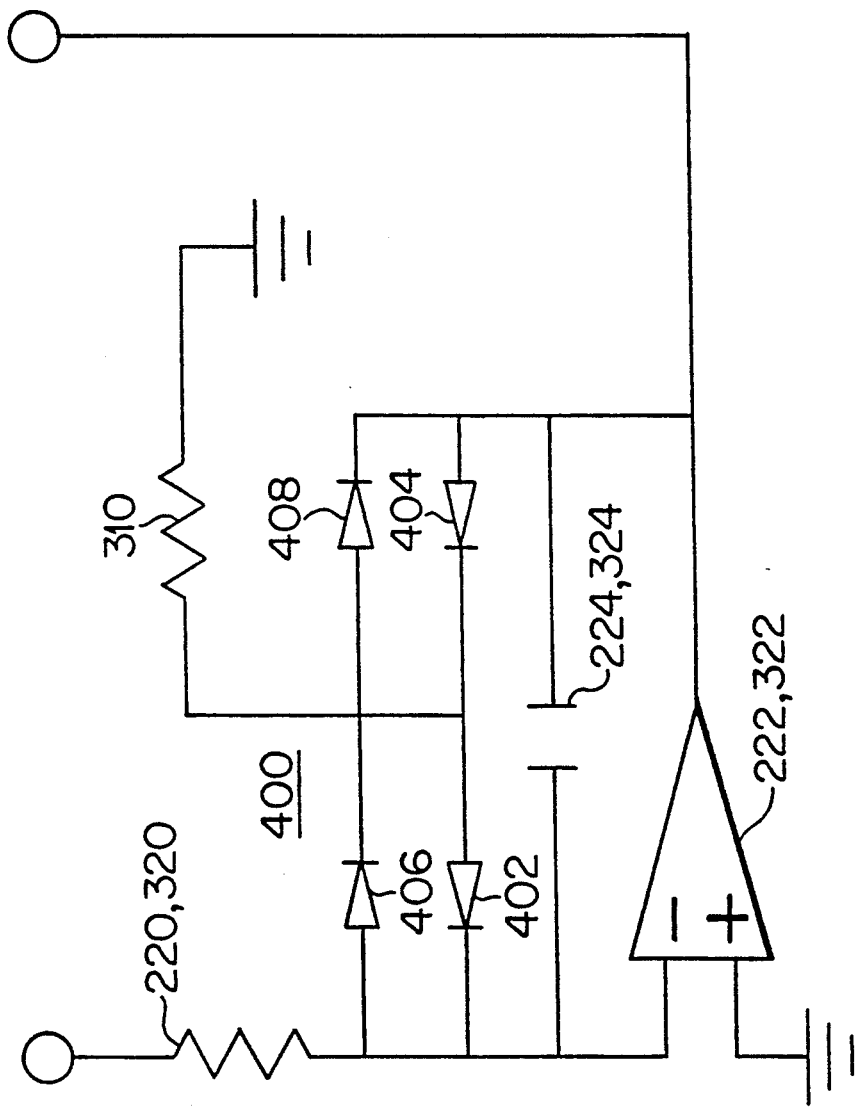
FIG. 4 is a circuit diagram of an integrator circuit.

Referring now to FIG. 4, therein is shown a preferred embodiment of a feedback means, which further includes voltage limiting means connected to the capacitor to limit the voltage buildup across the capacitor. As indicated by the multiple element numbers, the preferred feedback means shown in FIG. 4 may be used in either embodiment shown in FIG. 2 or FIG. 3.

In particular, a diode Tee circuit 400 consisting of diodes 402, 404, 406, and 408 is connected across capacitor 224 (FIG. 2) or 324 (FIG. 3). The diodes in Tee circuit 400 are connected to ground through a resistor 310. The diode Tee circuit prevents the absolute value of the voltage across capacitor 224 or 324 from exceeding a voltage greater than two times the turn-on voltage of the appropriate diodes. The added resistor 310 decreases greatly the current through diodes 402 and 406 when the absolute value of the voltage at the output of operational amplifier 222 or 322 is less than the turn-on voltage of one diode. At equilibrium of the feedback circuit, the absolute value of the voltage at the output of operational amplifier 222 or 322 should be less than the turn-on voltage of one normal diode. Accordingly, the diode network 400 prevents excess voltage buildup across capacitor 224, 324, and thereby allows the circuit to stabilize more rapidly.

The present invention may advantageously be used, for example, as a component in a quadrature bandpass filter.

Following will be a description of a preferred technique to adjust the gain of the adjustable amplifier means and to adjust the offset of the feedback means to obtain optimum performance of the disclosed circuits in FIGS. 2 and 3. To adjust the gain of the adjustable amplifier means, the feedback means must be disconnected from the remainder of the circuit by breaking the connection at terminals 228 or 328. The gain of operational amplifier 204 or 304 is then adjusted via variable resistor 206 or 306, respectively, to cause the change in the output voltage at terminals 214, 310, in response to a change in the input voltage at terminals 200, 300, to be equal to a known constant times the change in the input voltage at terminals 200, 300. This known constant equals the ratio between the resistors 216 and 218, or resistors 316 and 318. If these two resistors are equal, then the change in the output voltage at terminals 214, 310 will be $-1$ times the change in the input voltage at terminals 200, 300.

Next, terminals X-X 228 or 328 are reconnected to adjust the offset of operational amplifier 222 or 322 with variable resistor 226 or 326, respectively. Input terminals 200 or 300 to the filter are shorted to ground, and variable resistor 226 or 326 is adjusted to zero the output of the circuit at terminals 214, 310.

This adjustment procedure prevents a mismatch between the D.C. gain defined by the feedback means and the low-frequency gain defined by the lowpass filter means, and ensures optimum performance.

It will be apparent to those skilled in the art that various modifications and variations can be made in the lowpass filter of the present invention and in its construction without departing from the scope and spirit of the invention.

Other embodiments of the invention will be apparent to those skilled in the art for consideration of the specification and practice of the invention disclosed herein. It is intended that the specification and examples be considered as exemplary only, with the true scope and spirit of the invention be indicated by the following claims.

What is claimed is:

1. A lowpass filter having a filter input that receives an input signal having a D.C. component and a filter output that provides an output signal, comprising:

means for lowpass filtering the input signal to produce a filtered signal;

adjustable amplifying means for amplifying the filtered signal to produce the output signal;

offset detecting means connected to the filter input and the filter output for producing an offset signal corresponding to the D.C. offset between the output signal and the input signal; and feedback means connected to the offset detecting means and the adjustable amplifying means, for producing a feedback signal corresponding to the offset signal and for controlling the adjustable amplifying means to reduce any D.C. offset between the input and output signals.

2. The lowpass filter of claim 1, wherein the lowpass filtering means includes a switched capacitor lowpass filter.

3. The lowpass filter of claim 1, wherein the adjustable amplifying means includes an operational amplifier and an adjustable resistor connected to the operational amplifier for adjusting the gain of the adjustable amplifying means.

4. The lowpass filter of claim 1, wherein the offset detecting means includes a voltage divider circuit.

5. The lowpass filter of claim 1, wherein the feedback means includes an integrator means for integrating the offset signal produced by the offset detecting means.

6. The lowpass filter of claim 5, wherein the integrator means includes a resistor and a capacitor both connected to an operational amplifier.

7. The lowpass filter of claim 5, wherein the integrator means includes a means for adjusting offset of the integrator means.

8. The lowpass filter of claim 6, wherein the feedback means further includes voltage limiting means connected to the capacitor to limit voltage buildup across the capacitor.

9. The lowpass filter of claim 8, wherein the voltage limiting means includes a diode Tee circuit.

10. The lowpass filter of claim 1, wherein the feedback means produces a feedback signal which is opposite in polarity with respect to the offset signal.

* * * * *